(12) United States Patent
Traijkovic et al.

(10) Patent No.: US 6,426,520 B1
(45) Date of Patent: Jul. 30, 2002

(54) SEMICONDUCTOR DEVICE

(75) Inventors: Tatjana Traijkovic; Florin Udrea; Gehan Anil Joseph Amaratunga, all of Cambridge (GB)

(73) Assignee: Dynex Semiconductor Limited, Lincoln (GB)

( * ) Notice: Subject to any disclaimer, the term of this patent is extended or adjusted under 35 U.S.C. 154(b) by 0 days.

(21) Appl. No.: 09/636,111

(22) Filed: Aug. 10, 2000

(30) Foreign Application Priority Data

Aug. 11, 1999 (GB) ............................................. 99118980

(51) Int. Cl.[7] .............................................. H01L 29/74
(52) U.S. Cl. ....................................... 257/107; 257/127
(58) Field of Search .............................. 357/52, 20, 43, 357/13, 23.4, 360, 107, 115, 170, 171, 181, 127

(56) References Cited

U.S. PATENT DOCUMENTS

| | | | | |
|---|---|---|---|---|
| 3,971,061 A | * | 7/1976 | Matsushita et al. | ............ 357/52 |
| 4,003,072 A | * | 1/1977 | Matsushita et al. | ............ 357/52 |
| 4,267,557 A | * | 5/1981 | Muramoto et al. | ............ 357/20 |
| 4,329,705 A | * | 5/1982 | Baker | ............ 357/43 |
| 4,825,266 A | * | 4/1989 | Whight | ............ 357/13 |
| 5,136,349 A | * | 8/1992 | Yilmaz et al. | ............ 357/23.4 |
| 5,548,152 A | * | 8/1996 | Arai | ............ 257/360 |

OTHER PUBLICATIONS

WO 83/0077, Mar. 1983, Diode For Monolithic Integrated Circuit.

* cited by examiner

*Primary Examiner*—David Nelms
*Assistant Examiner*—Bau T Le
(74) *Attorney, Agent, or Firm*—Pearne & Gordon LLP

(57) ABSTRACT

A semiconductor device comprises an active area with a voltage termination structure located adjacent to the active area at an edge portion of the device. The edge portion comprises a substrate region (23, 24) of a first semiconductor type, and the voltage termination structure comprises first and second layers (21 and 22) formed within the substrate region. The first and second layers (21 and 22) define regions each of a second semiconductor type.

20 Claims, 4 Drawing Sheets

SEMICONDUCTOR DEVICE

This invention relates to a semiconductor device, and in particular to a power semiconductor device such as an accumulation layer emitted thyristor (ALET) and to a large class of high to ultra-high voltage devices such as diodes, DMOSFETs, DMOS IGBTs, trench MOSFETs and trench IGBTs.

In order to prevent voltage breakdown at the edges of a power semiconductor device such as an ALET, the device (which is typically built in a relatively large silicon wafer) is provided with a termination structure. A standard termination structure utilises a floating ring termination technique having, say, p-type regions (rings) in a surface layer surrounding the active region (of n-type material) of the device.

The success of a controllable semiconductor device at high or ultra-high voltages is almost entirely determined by a successful implementation of the edge termination. There are three main reasons which make the termination problem more difficult as the voltage ratings increase. Firstly, the number of floating rings increases significantly, and thus the wasted area and the ratio between the wasted area and the active area increases. This results in a poorer yield and a higher on-state voltage. Secondly, as the voltage increases, and accordingly the doping concentration of the base decreases, the device is more prone to parasitic field charge or passivation charge effects, which may cause premature breakdown. Thirdly, as the number of rings increases, the control of the depth and spacing between the rings becomes even tighter than that for a relatively-lower voltage termination, and therefore the termination effectiveness is very susceptible to process variations.

The present invention provides a semiconductor device comprising an active area with a voltage termination structure located adjacent to the active area at an edge portion of the device, the edge portion comprising a substrate region of a first semiconductor type, wherein the voltage termination structure comprises first and second layers formed within the substrate region, the first and second layers defining regions each of a second semiconductor type.

Preferably, the first and second layers of the voltage termination structure each comprises a plurality of semiconductor regions.

In a preferred embodiment, the edge portion surrounds the active area, the first and second layers of the voltage termination structure extending around the edge portion. Conveniently, the first and second layers of the voltage termination structure are formed as rings.

Advantageously, the first layer of the voltage termination structure is formed in the region of an upper surface of the substrate region, the second voltage termination layer being formed beneath the first layer. Preferably, a cathode is formed on the first layer on said upper surface of the substrate region, and an anode is formed on an opposite surface of the substrate region. In the off-state of the device, the voltage potential, against which the termination structure provides edge breakdown protection, is coupled between the cathode and the anode.

Preferably, the first substrate region is formed of n-type semiconductor material, and the first and second layers of the voltage termination are formed of p-type semiconductor material, and the substrate region comprises first and second substrate layers. In the latter case, the second voltage termination layer is located at the junction between the first and second substrate layers, the first substrate layer is an epitaxial layer, and the second substrate layer is a drift layer.

Advantageously, the active area comprises a gate portion in the form of a trench which extends from an upper edge of the substrate region into an active area substrate region.

Conveniently, the plurality of semiconductor regions comprising the second voltage termination layer are formed so as to be equidistant to each other.

Preferably, the plurality of semiconductor regions comprising the second voltage termination layer are formed so as to provide an optimised potential distribution.

The semiconductor regions may be formed as separate rings, or as a mesh arrangement. It will be appreciated that the separate rings are not necessarily circular, but should substantially surround the active area of the device.

In a preferred embodiment, the plurality of semiconductor regions comprising the first voltage termination layer are formed so that their upper edges are in alignment with an upper edge of the active area of the device.

Advantageously, the semiconductor regions comprising the first voltage termination layer are arranged adjacent to one another. Preferably, the doping concentration of the semiconductor regions comprising the first voltage termination layer decreases as the distance from the active area of the device increases.

In a preferred embodiment, the semiconductor regions of the first voltage termination layer are floating p+ rings in the upper part of the substrate region.

A power semiconductor device constructed in accordance with the invention will now be described in greater detail, by way of example, with reference to the drawings, in which.

Figure 1:
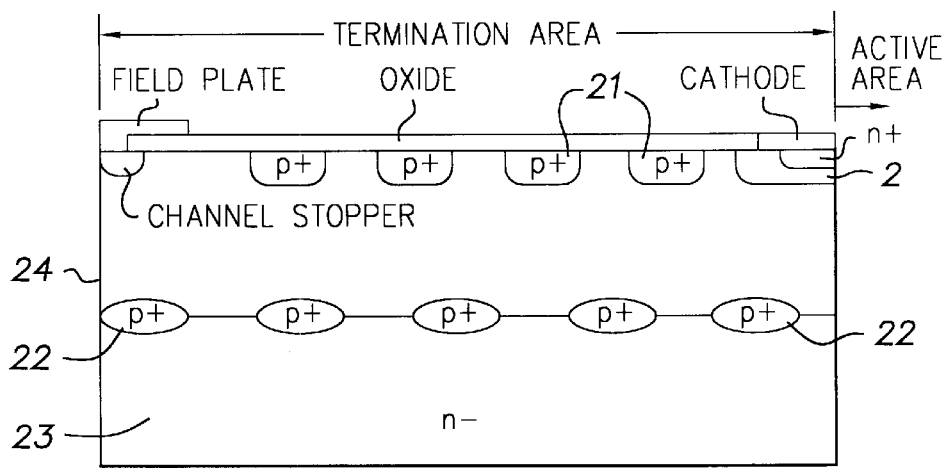
FIG. 1 is a sectional view of the edge termination structure of the device.
Figure 2:
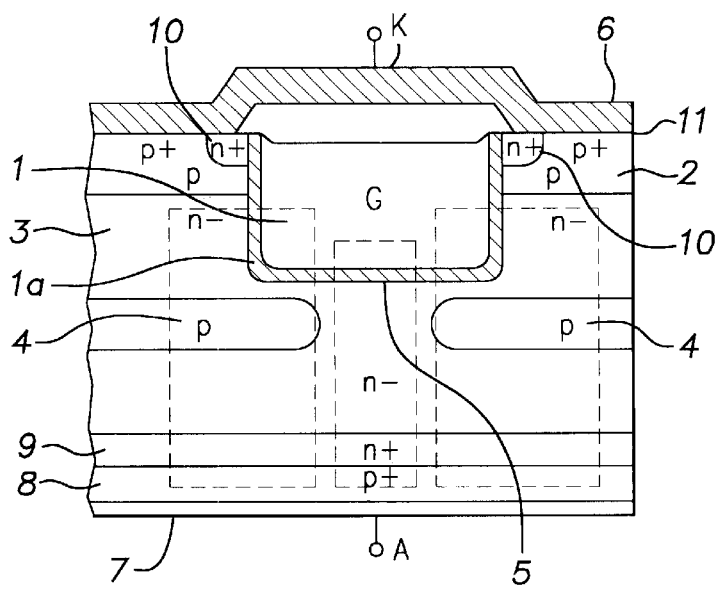
FIG. 2 is a sectional view of part of the active area of the device.

Referring to the drawings, FIG. 1 shows the edge termination structure of an ALET, and FIG. 2 shows the adjacent portion of the active area of the device. This device has a gate 1 in the form of a trench which extends through a region 2 of p-type silicon into an underlying n-type region 3 of low conductivity. Buried p regions 4 below the bottom of the trench form part of a thyristor which, in operation, is triggered into conduction by conduction of a PIN diode, which is produced when an accumulation layer 5 is formed in the n-type region 3 adjacent to the trench, under the action of a gate signal. The device has a high on-state conductivity, and is protected against high voltage breakdown in its off-state by the presence of the buried layer. A cathode 6 is attached to the upper surface of the region 2 of p-type silicon, and an anode 7 is provided at the lower surface of the device. In the off-state, the voltage potential, against which the termination provides edge breakdown protection, is coupled between the cathode 6 and the anode 7. The device is described in greater detail in our British patent specification 2327295.

The device has a p+ silicon substrate 8 having the anode 7 on its lower surface. The n-type region 3 is an n-type epitaxial layer formed above an intermediate n+ epitaxial layer 9. The trench electrode 1 is of conductive polysilicon, and is provided with a thin insulating oxide layer 1a at its outer surface. Small cathode diffusion regions 10 of n+ silicon are formed at the upper surface 11 of the device when it abuts the oxide layer 1a. The pn junction between the regions 2 and 10 is electrically shorted at the surface 11 by the cathode 6.

The region 2 is formed by diffusion into the n-type region 3, and the buried p regions 4 are also formed by diffusion into the region 3 during a pause in its epitaxial growth. As shown in FIG. 1, the edge termination structure has a double layer configuration, having a first layer of shallow p+ rings 21 and a second layer of buried p+ rings 22. The rings 21 are formed at the same level as the upper region 2 of p-type silicon (only the extreme edge of which can be seen in FIG. 1) of the ALET. The rings 22 are formed at the junction of an n-drift layer 23 and an n-epitaxial layer 24 which are formed at the same time as the n-type region 3 of the active area of the device.

In the case of a 6.5 kV device, for example, the doping concentration of the n-drift layer 23 is $1\times10^{12}$ cm$^{-3}$. The p+ buried rings 22 are equidistant with a 5 $\mu$m/5 $\mu$m width/ spacing aspect ratio. The top concentration of the p+ buried rings 22 is $1\times10^{16}$cm$^{-3}$. The n-layer 24 grown above the buried rings 22 has a doping concentration of $5\times10^{3}$cm$^{-3}$, and a thickness of 7 $\mu$m. The p+ surface rings 21 have a depth of 2 $\mu$m, and a typical concentration of $1\times10^{18}$cm$^{-3}$.

The p+ shallow rings 21 are preferably formed at the same time as the p-type region 2, and more preferably using the same mask. Similarly, the p+ buried rings 22 are preferably formed at the same time as the buried regions 4, and more preferably using the same mask.

The p+ buried rings 22 act as a first potential lines filter, thus helping the spreading of the depletion region laterally, and realising a first step towards distributing the potential lines uniformly at the surface. The p+ shallow surface rings 21 constitute a second filter, which helps further the redistribution of the potential lines evenly across the surface 11.

Figure 3:
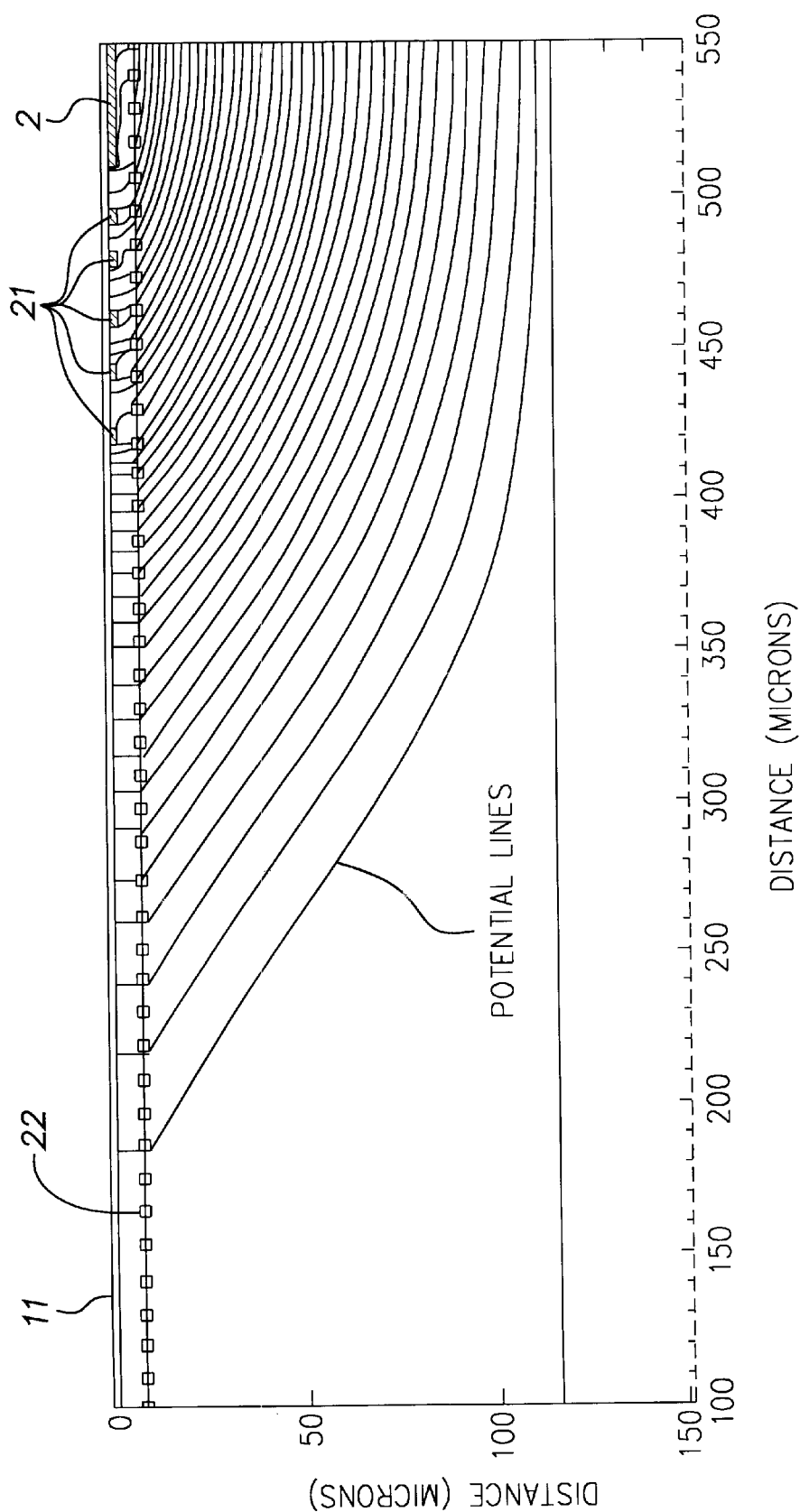
FIG. 3 shows the potential distribution for a similar edge termination structure to that of FIG. 1.

FIG. 3 shows the distribution of the potential lines for a 1.2 kV device, and illustrates the even distribution which results from the double layer termination of the invention. A 1.2 kV device is used for this illustration, as the distribution for a 6.5 kV device would show many more potential lines, and this would make it difficult to see the even distribution.

The p+ buried rings 22 may be equidistant to each other, or they may be laid out in such way as to give an optimised potential distribution. In the first case, there is no need for aligning the p+ buried rings 22 to the surface 11, and they can be simply used in conjunction with the ALET. In the second case, the p+ rings 22 need to be aligned to the main surface 11, and the termination can be used for a more general purpose.

In comparison with a conventional termination technique, the use of the p+ buried rings 22 helps the distribution of the potential lines more uniformly at the surface, without sacrificing the surface area. Thus, in the conventional techniques, the use of several large and deep p+ buried rings results in a large wasted area, since the depletion region can only spread between those rings. In the termination of the invention, the p+ surface rings 21 are very shallow and narrow, and their number is limited (the p+ surface rings are mainly needed in the proximity of the active area). For a 6.5 kV termination, the use of this termination technique may result in the termination region being as little as a half of that conventionally needed.

At the same time, the use of the buried layer implant 4, and the subsequent epitaxial growth, allows the n-layer 24 above the buried rings 22 to have a higher doping concentration than the bulk concentration of the nlayer 23, and therefore results in a device less susceptible to parasitic charges in the oxide or passivation layers.

Finally, the careful use of the p+ buried rings 22 may result in a higher breakdown voltage than that offered by a conventional termination, since the actual breakdown spot may be forced to take place in the bulk between two buried rings and not at the surface 11.

Figure 4:
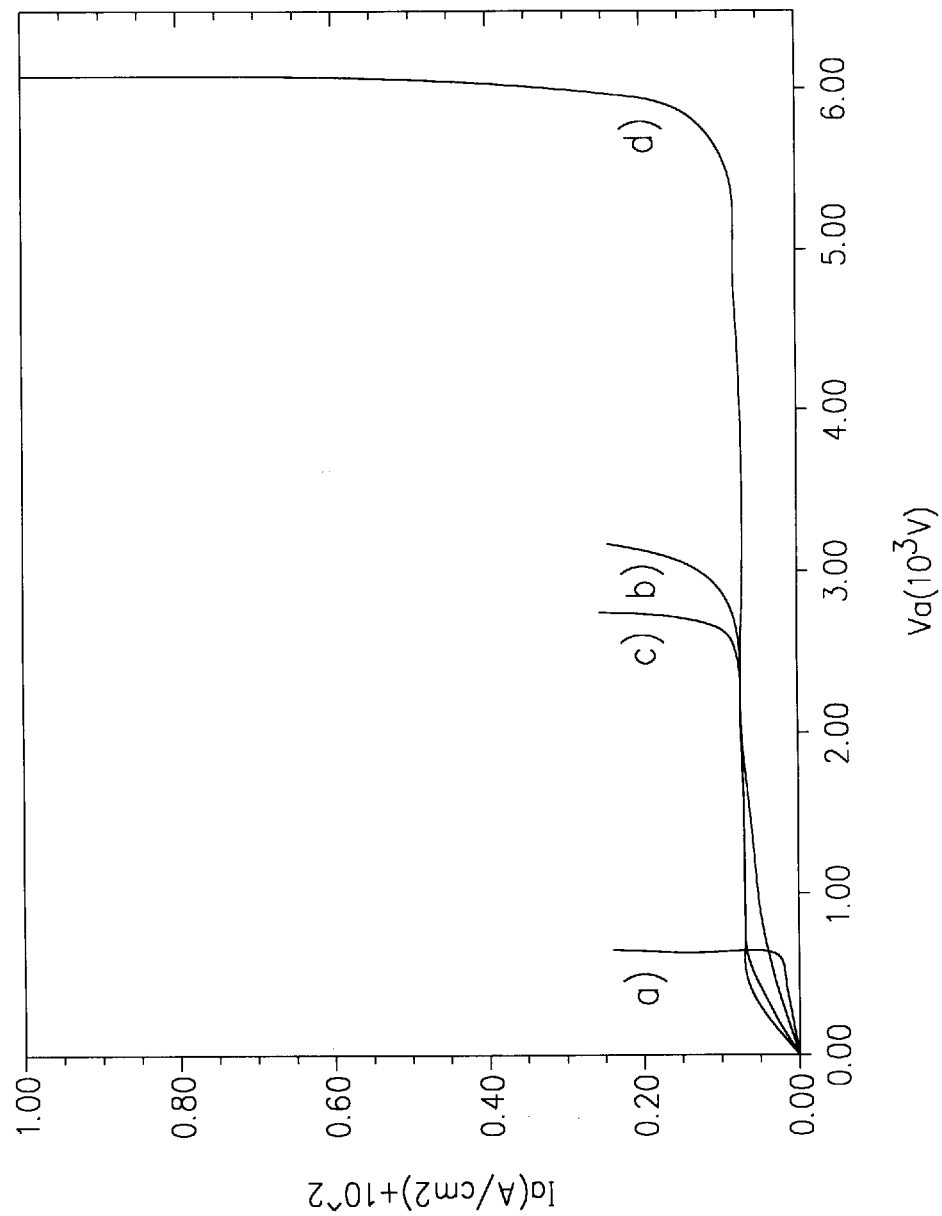
FIG. 4 shows the breakdown characteristics for the device of FIG. 1.

The graph of FIG. 4 shows the numerical simulations of the breakdown voltage for the 6.5 kV ALET of FIG. 1 with (a) no termination, (b) p+ surface rings only, (c) equidistant p+ buried layer rings only, and (d) the double layer termination of the invention, namely the p+ buried rings 21 and the p+ surface rings 21. Clearly, the double layer termination technique of the invention leads to much superior breakdown characteristics than either of the known techniques.

Figure 5:
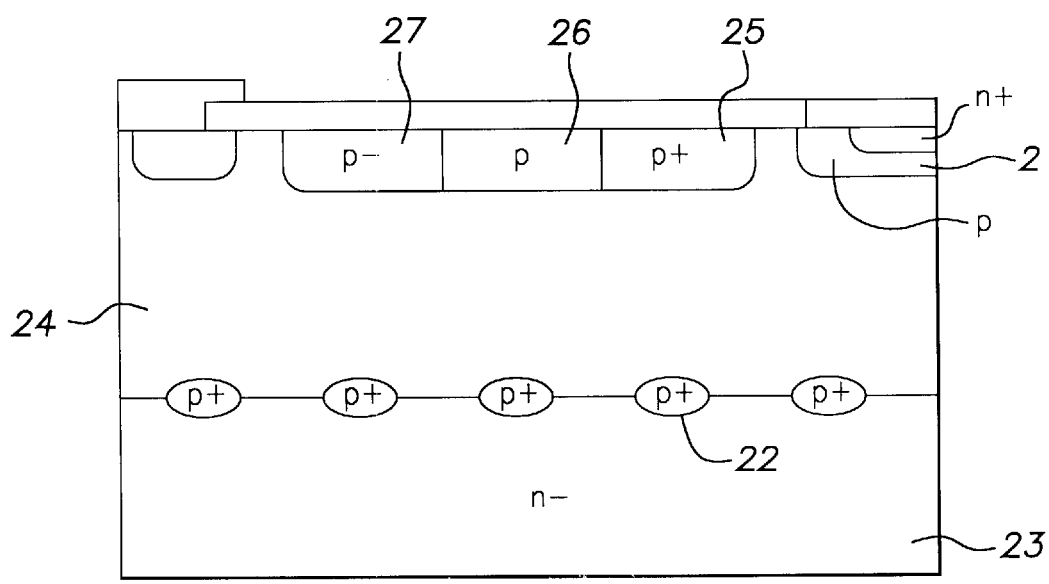
FIG. 5 is a sectional view of a modified form of the edge termination structure of FIG. 1.

FIG. 5 shows a modified form of the structure of FIG. 1, wherein the first voltage termination layer is made of several (at least two) conductive regions (25, 26, 27) such that the region 25 closest to the active area is highly doped; and, as the distance from the active area increases, the doping of these regions 26, 27 decreases. The purpose of the second voltage termination layer is to act as a first filter for the potential lines, whilst the first voltage termination layer, comprising the above-mentioned regions 25,26,27, provides even distribution of the potential lines at the device surface. Preferably, at least one of the p type regions 25, 26, 27 is formed at the same time, and/or uses the same mask, as that used to form the p-base region 2.

It will be apparent that the edge termination structure described above in connection with an ALET could be used with other power semiconductor devices, and in particular to a large class of high to ultra-high voltage devices such as diodes, DMOSFETs DMOS IGBTs, trench MOSFETS and trench IGBTs.

What is claimed is:

1. A semiconductor device comprising an active area with a voltage termination structure located adjacent to the active area at an edge portion of the device, the edge portion comprising a substrate region of a first semiconductor type, the voltage termination structure comprising first and second layers formed within the substrate region, and the first and second layers defining regions each of a second semiconductor type, wherein the first layer of the voltage termination structure is formed in the region of an upper surface of the substrate region, the second voltage termination layer is formed beneath the first layer, and the second voltage termination layer is formed within the substrate region of the first semiconductor type and spaced from a lower surface of said substrate region.

2. A semiconductor device according to claim 1, wherein the first and second layers of the voltage termination structure each comprises a plurality of semiconductor regions.

3. A semiconductor device according to claim 2, wherein the plurality of semiconductor regions comprising the second voltage termination layer are formed so as to be equidistant to each other.

4. A semiconductor device according to claim 2, wherein the plurality of semiconductor regions comprising the second voltage termination layer are formed so as to provide an optimized potential distribution.

5. A semiconductor device according to claim 4, wherein the plurality of semiconductor regions comprising the first voltage termination layer are formed so that their upper edges are in alignment with an upper edge of the active area of the device.

6. A semiconductor device according to claim 2, wherein the semiconductor regions comprising the first voltage termination layer are arranged adjacent to one another.

7. A semiconductor device according to claim 2, wherein the doping concentration of the semiconductor regions comprising the first voltage termination layer decreases as the distance from the active area of the device increases.

8. A semiconductor device as claimed in claim 2, wherein the semiconductor regions of the first voltage termination layers are floating p+ rings in the upper part of the substrate region.

9. A semiconductor device according to claim 1 or 2, wherein the device performs as an accumulation layer emitter thyristor (ALET), a diode, a DMOSFET, DMOS IGBT, a trench MOSFET, or a trench IGBT.

10. A semiconductor device according to claim 1, wherein the edge portion surrounds the active area, the first and second layers of the voltage termination structure extending around the edge portion.

11. A semiconductor device according to claim 1, wherein the first and second layers of the voltage termination structure are formed as rings.

12. A semiconductor device according to claim 1 further comprising a cathode formed adjacent to the first layer of said upper surface of the substrate region, and an anode formed on an opposite surface of the substrate region.

13. A semiconductor device according to claim 12, wherein, in the off-state of the device, the voltage potential against which the termination structure provides edge breakdown protection, is coupled between the cathode and the anode.

14. A semiconductor device according to any preceding claim, wherein the first substrate region is formed of n-type semiconductor material, and the first and second layers of the voltage termination structure are formed of p-type semiconductor material.

15. A semiconductor device according to any one of claims 1 to 7, wherein the substrate region comprises first and second substrate layers.

16. A semiconductor device according to claim 15, wherein the second voltage termination layer is located at the junction between the first and second substrate layers.

17. A semiconductor device according to claim 15, wherein the first substrate layer is an epitaxial layer, and the second substrate layer is a drift layer.

18. A semiconductor device according to claim 15, wherein the active area extends into the first substrate layer from the upper surface of the substrate region.

19. A semiconductor device according to claim, 15, wherein the doping concentration of the first substrate layer is higher than that of the second substrate layer.

20. A semiconductor device according to claim 1 or claim 12, wherein the active area comprises a gate portion in the form of a trench which extends from an upper edge of the substrate region into an active area substrate region.

* * * * *

UNITED STATES PATENT AND TRADEMARK OFFICE
CERTIFICATE OF CORRECTION

PATENT NO. : 6,426,520 B1  
DATED : July 30, 2002  
INVENTOR(S) : Tatjana Traijkovic et al.

It is certified that error appears in the above-identified patent and that said Letters Patent is hereby corrected as shown below:

Title page,  
Item [30], Foreign Application Priority Data, please delete "99118980", and insert therefor -- 9918980 --.

Column 3,  
Line 62, please delete "nlayer", and insert therefor -- n-layer --.

Column 5,  
Lines 25-26, please delete "preceding claim", and insert therefor -- any one of claims 1, 2, 10-13 --.

Column 6,  
Line 5, please delete "1 to 7", and insert therefor -- 1, 2, 10-13 --.

Signed and Sealed this

Eleventh Day of March, 2003

JAMES E. ROGAN  
*Director of the United States Patent and Trademark Office*